(12) United States Patent
Chen

(10) Patent No.: US 8,502,223 B2
(45) Date of Patent: Aug. 6, 2013

(54) SILICON WAFER HAVING TESTING PAD(S) AND METHOD FOR TESTING THE SAME

(75) Inventor: Chi-Han Chen, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 591 days.

(21) Appl. No.: 12/726,812

(22) Filed: Mar. 18, 2010

(65) Prior Publication Data

US 2010/0276690 A1 Nov. 4, 2010

(30) Foreign Application Priority Data

Apr. 30, 2009 (TW) .............................. 98114521 A

(51) Int. Cl.
*H01L 23/58* (2006.01)
*H01L 23/48* (2006.01)

(52) U.S. Cl.
USPC .............................. 257/48; 257/698; 257/773

(58) Field of Classification Search
USPC .................... 257/48, E21.531, E23.179, 698, 257/773, 774
See application file for complete search history.

(56) References Cited

U.S. PATENT DOCUMENTS

| 6,100,589 A | * | 8/2000 | Tanaka | 257/758 |
| 2008/0210935 A1 | * | 9/2008 | Ebara | 257/48 |

FOREIGN PATENT DOCUMENTS

| CN | 101075595 A | 11/2007 |
| CN | 101256997 A | 9/2008 |
| TW | 200423352 A | 11/2004 |
| TW | 200826216 A | 6/2008 |

OTHER PUBLICATIONS

Office Action issued on Sep. 13, 2012 by the Intellectual Property Office of R.O.C.(TIPO) for Taiwan Application No. 098114521, 5 pages, and Summary of Office Action, 2 pages.

* cited by examiner

*Primary Examiner* — Hung Vu
(74) *Attorney, Agent, or Firm* — McCracken & Frank LLC

(57) ABSTRACT

The present invention relates to a silicon wafer having testing pad(s) and a method for testing the same. The silicon wafer includes a silicon substrate, an insulation layer, at least one testing pad and a dielectric layer. The testing pad includes a first metal layer, a second metal layer and at least one first interconnection metal. The first metal layer is disposed on the insulation layer, and has a first area and a second area. The first area and the second area are electrically insulated with each other. The second metal layer is disposed above the first metal layer. The first interconnection metal connects the second area of the first metal layer and the second metal layer. Therefore, when a through hole and a seed layer are formed in the following processes, the through hole is estimated whether it is qualified by probing the testing pad to know whether the seed layer connects the second area of the first metal layer of the testing pad, thus the yield rate of the following processes is increased.

18 Claims, 6 Drawing Sheets

US 8,502,223 B2

SILICON WAFER HAVING TESTING PAD(S) AND METHOD FOR TESTING THE SAME

BACKGROUND OF THE INVENTION

1. Field of the Invention

The present invention relates to a silicon wafer and a method for testing the same, and more particularly to a silicon wafer having testing pad(s) and a method for testing the same.

2. Description of the Related Art

FIG. 1 shows a cross-sectional view of a first conventional silicon wafer. The silicon wafer 1 comprises a silicon substrate 11, an insulation layer 12, a pad 13 and a dielectric layer 14. The insulation layer 12 is disposed on the silicon substrate 11. The pad 13 is disposed on the insulation layer 12. The dielectric layer 14 is disposed on the insulation layer 12. The dielectric layer 14 covers the pad 13, and exposes a surface 131 of the pad 13.

The conventional silicon wafer 1 has the following disadvantages. Before forming a through via 19 under the pad 13, the silicon substrate 11 must be etched to form a through hole 15. However, during the formation of the through hole 15, the etching rate at the center of the through hole 15 is greater than that at the periphery of the through hole 15, so that the shape of the top of the through hole 15 is similar to arc, and the through hole 15 only exposes a little part of the pad 13. When forming a seed layer 16 on the wall of the through hole 15 in the following processes, even if the pad 13 and the seed layer 16 are already electrically connected to each other, the connecting area between the pad 13 and the seed layer 16 is small, causing higher resistance and bad influence to electrical property.

FIG. 2 shows a cross-sectional view of a second conventional silicon wafer. The silicon wafer 1A is formed by forming a conducting layer 17 on the seed layer 16 of the silicon wafer 1 (FIG. 1) and removing part of the silicon substrate 11, so as to form a plurality of grooves 18. The grooves 18 surround the seed layer 16 and are used to be filled up with an isolating material (not shown), so that the seed layer 16 and the silicon substrate 11 are electrically insulated with each other. Therefore, the grooves 18 must penetrate through the silicon substrate 11, and expose the insulation layer 12. However, conventionally, the silicon wafer 1 must be sliced after the grooves 18 are formed, so as to observe the cross-sectional structure of the grooves 18 in order to know whether the grooves 18 actually penetrate through the silicon substrate 11, which increases manufacturing cost.

Therefore, it is necessary to provide a silicon wafer having testing pad(s) and a method for testing the same to solve the above problems.

SUMMARY OF THE INVENTION

"The present invention is directed to a silicon wafer having testing pad(s). The silicon wafer comprises a silicon substrate, an insulation layer, at least one testing pad and a dielectric layer. The silicon substrate has a first surface and a second surface. The insulation layer is disposed on the first surface of the silicon substrate. The testing pad is disposed on the insulation layer and has a surface. The testing pad comprises a first metal layer, a second metal layer and at least one first interconnection metal. The first metal layer is disposed on the insulation layer. The first metal layer has a first area and a second area, and the first area and the second area are separated from each other. The second metal layer is disposed above the first metal layer. The first interconnection metal connects the second area of the first metal layer and the second metal layer. The dielectric layer is disposed on the insulation layer, and exposes the surface of the testing pad."

The present invention is further directed to a method for testing a silicon wafer having testing pad(s). The method comprises the following steps: (a) providing a silicon wafer, wherein the silicon wafer comprises a silicon substrate, an insulation layer, at least one testing pad and a dielectric layer, the silicon substrate has a first surface and a second surface, the insulation layer is disposed on the first surface of the silicon substrate, the testing pad is disposed on the insulation layer and has a surface, the testing pad comprises a first metal layer, a second metal layer and at least one first interconnection metal, the first metal layer is disposed on the insulation layer, the first metal layer has a first area and a second area, the first area and the second area are electrically insulated with each other, the second metal layer is disposed above the first metal layer, the first interconnection metal connects the second area of the first metal layer and the second metal layer, the dielectric layer is disposed on the insulation layer and exposes the surface of the testing pad; (b) removing part of the silicon substrate and part of the insulation layer from the second surface of the silicon substrate, so as to form at least one through hole and expose part of the first metal layer; (c) forming at least one seed layer on the wall of the through hole and the second surface of the silicon substrate; and (d) measuring resistance by two first probes.

Therefore, when a through hole and a seed layer are formed in the following processes, the through hole is estimated whether it is qualified by probing the testing pad to know whether the seed layer connects the second area of the first metal layer of the testing pad, thus the yield rate of the following processes is increased.

DETAILED DESCRIPTION OF TILE INVENTION

Figure 1:
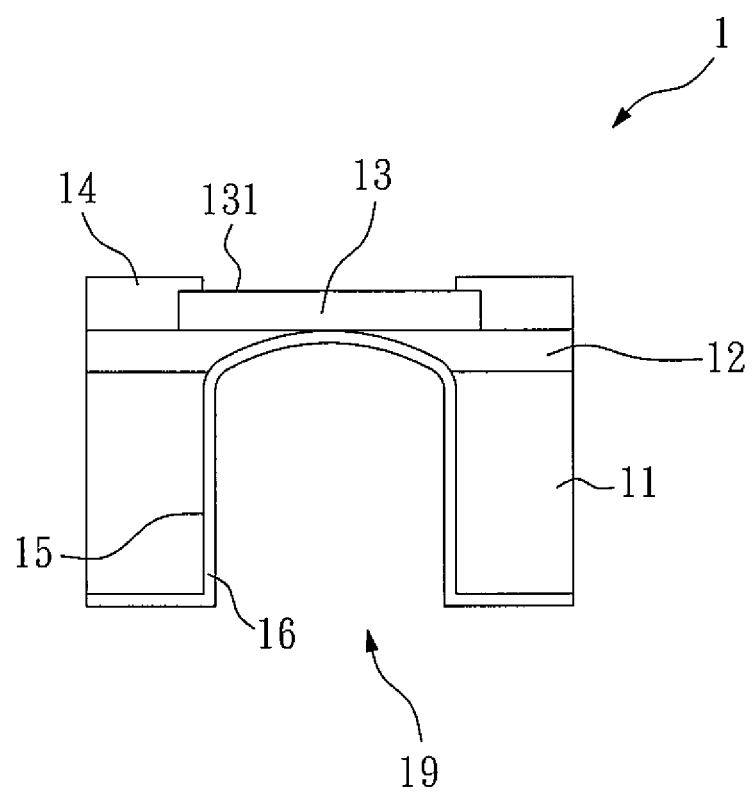
FIG. 1 is a cross-sectional view of a first conventional silicon wafer.
Figure 2:
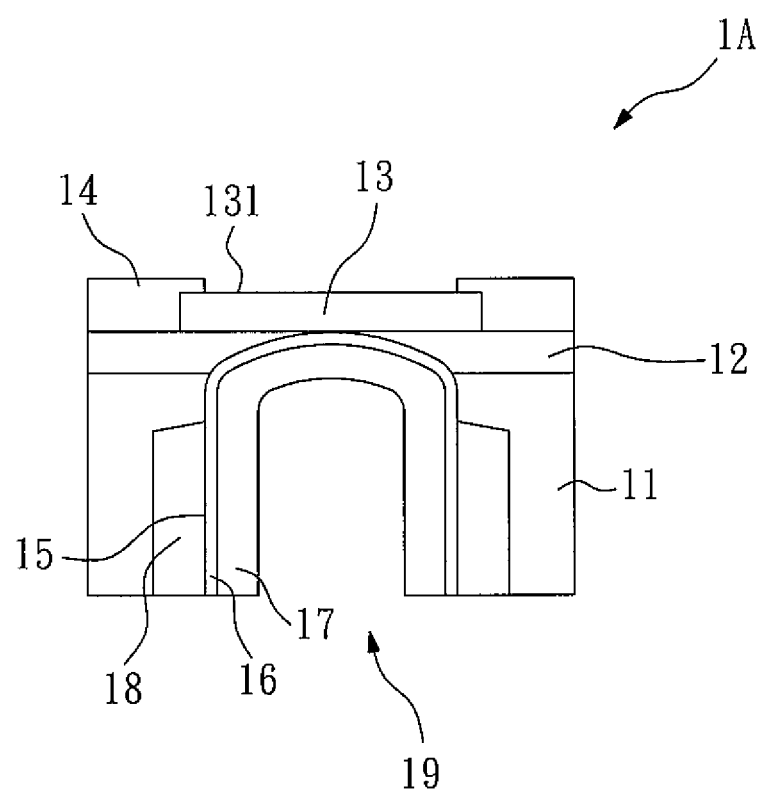
FIG. 2 is a cross-sectional view of a second conventional silicon wafer.
Figure 3:
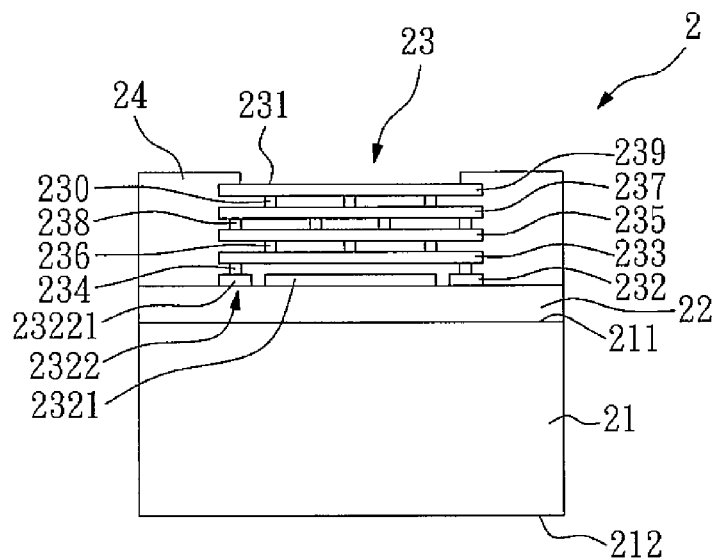
FIGS. 3 to 6 are schematic views of a method for testing a silicon wafer having testing pad(s) according to a first embodiment of the present invention.

FIGS. 3 to 6 show schematic views of a silicon wafer having testing pad(s) according to a first embodiment of the present invention. As shown in FIG. 3, a silicon wafer 2 is provided. The silicon wafer 2 is a silicon wafer having testing pad(s) according to a first embodiment of the present invention. The silicon wafer 2 comprises a silicon substrate 21, an insulation layer 22, at least one testing pad 23 and a dielectric layer 24. The silicon substrate 21 has a first surface 211 and a second surface 212. The insulation layer 22 is disposed on the first surface 211 of the silicon substrate 21. Preferably, the material of the insulation layer 22 is silicon oxide, polymer or other material that has insulating property.

The testing pad 23 is disposed on the insulation layer 22 and has a surface 231. The testing pad 23 comprises a first metal layer 232, a second metal layer 233 and at least one first interconnection metal 234. In the embodiment, the testing pad 23 further comprises a third metal layer 235, at least one second interconnection metal 236, a fourth metal layer 237, at least one third interconnection metal 238, a fifth metal layer 239 and at least one fourth interconnection metal 230.

Figure 4:
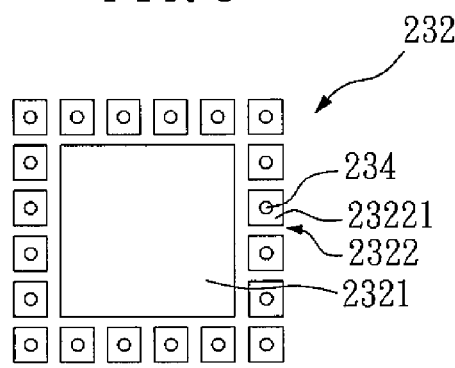
Figure 5:
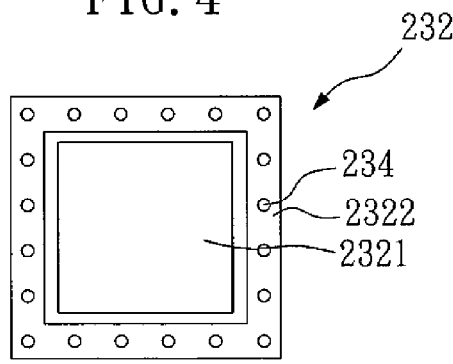

"The first metal layer 232 is disposed on the insulation layer 22. The first metal layer 232 has a first area 2321 and a second area 2322, and the first area 2321 and the second area 2322 are separated from each other, that is the first area 2321 and the second area 2322 are not connected to each other. In the embodiment, the second area 2322 of the first metal layer 232 surrounds the first area 2321, and the second area 2322 has a plurality of sub-areas 23221, as shown in FIG. 4. However, in other applications, the second area 2322 of the first metal layer 232 surrounds the first area 2321, and the second area 2322 is annular, as shown in FIG. 5. The second metal layer 233 is disposed above the first metal layer 232. The first interconnection metal 234 connects the second area 2322 of the first metal layer 232 and the second metal layer 233. In the present invention, the first area 2321 of the first metal layer 232 and the second metal layer 233 are not connected to each other."

The third metal layer 235 is disposed above the second metal layer 233, the second interconnection metal 236 connects the second metal layer 233 and the third metal layer 235. The fourth metal layer 237 is disposed above the third metal layer 235. The third interconnection metal 238 connects the third metal layer 235 and the fourth metal layer 237. The fifth metal layer 239 is disposed above the fourth metal layer 237. The fourth interconnection metal 230 connects the fourth metal layer 237 and the fifth metal layer 239. The dielectric layer 24 is disposed on the insulation layer 22. The dielectric layer 24 covers the testing pad 23, and exposes the surface 231 of the testing pad 23.

Figure 6:
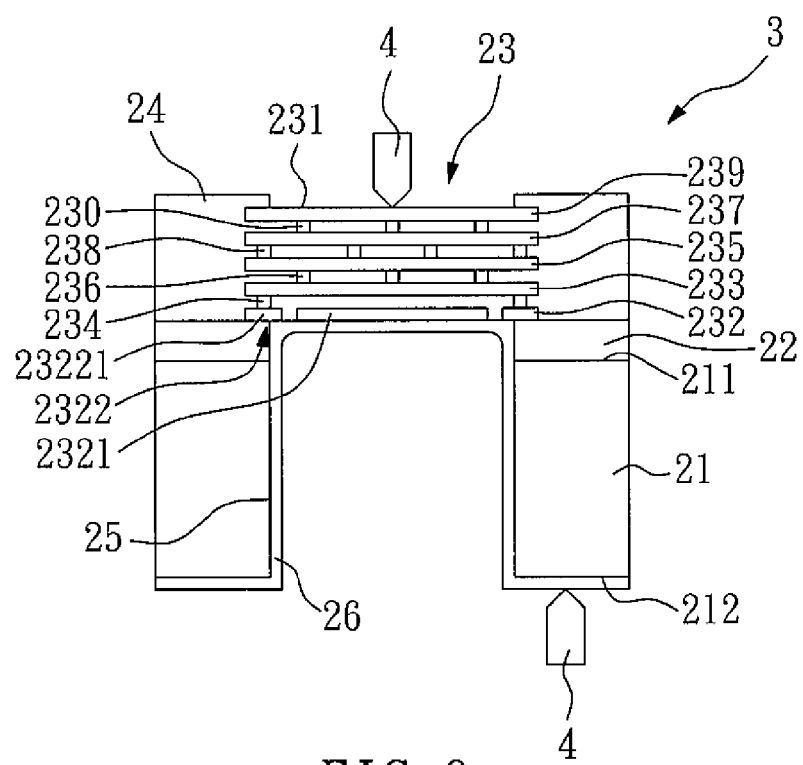

As shown in FIG. 6, part of the silicon substrate 21 and part of the insulation layer 22 are removed from the second surface 212 of the silicon substrate 21, so as to form at least one through hole 25 and expose part of the first metal layer 232. Preferably, the through hole 25 exposes the second area 2322 of the first metal layer 232. Then, at least one seed layer 26 is formed on the wall of the through hole 25 and the second surface 212 of the silicon substrate 21. The seed layer 26 contacts the first area 2321 and the second area 2322 of the first metal layer 232, and is electrically connected to the surface 231 of the testing pad 23 through the second area 2322. Meanwhile, a silicon wafer 3 having testing pad(s) according to a second embodiment of the present invention is formed. Preferably, the material of the seed layer 26 is copper-based alloy. Finally, resistance is measured by two first probes 4. In the embodiment, one of the first probes 4 contacts the surface 231 of the testing pad 23, and the other first probe 4 contacts the seed layer 26 that is disposed on the second surface 212 of the silicon substrate 21.

"The first area 2321 and the second area 2322 of the first metal layer 232 are separated from each other, and the first area 2321 of the first metal layer 232 and the second metal layer 233 are not connected to each other, that is, only when the seed layer 26 contacts the second area 2322 of the first metal layer 232, the seed layer 26 can electrically be connected to the surface 231 of the testing pad 23, Therefore, by measuring resistance between the seed layer 26 and the testing pad 23, it is estimated whether the contact area between the seed layer 26 and the first metal layer 232 of the testing pad 23 is large enough to cover the second area 2322. More particularly, if the resistance exceeds a critical value, it shows that a loop is not formed between the seed layer 26 and the testing pad 23, that is, the seed layer 26 does not contact the second area 2322 of the first metal layer 232 of the testing pad 23, and thus the yield rate is low. If the resistance is below the critical value, it shows that a loop is formed between the seed layer 26 and the testing pad 23, that is, the seed layer 26 contacts the second area 2322 of the first metal layer 232 of the testing pad 23, and thus the yield rate is high. Therefore, the through hole 25 is estimated whether it is qualified, so as to determine the necessity of the following processes. The yield rate of product is increased."

Figure 7:
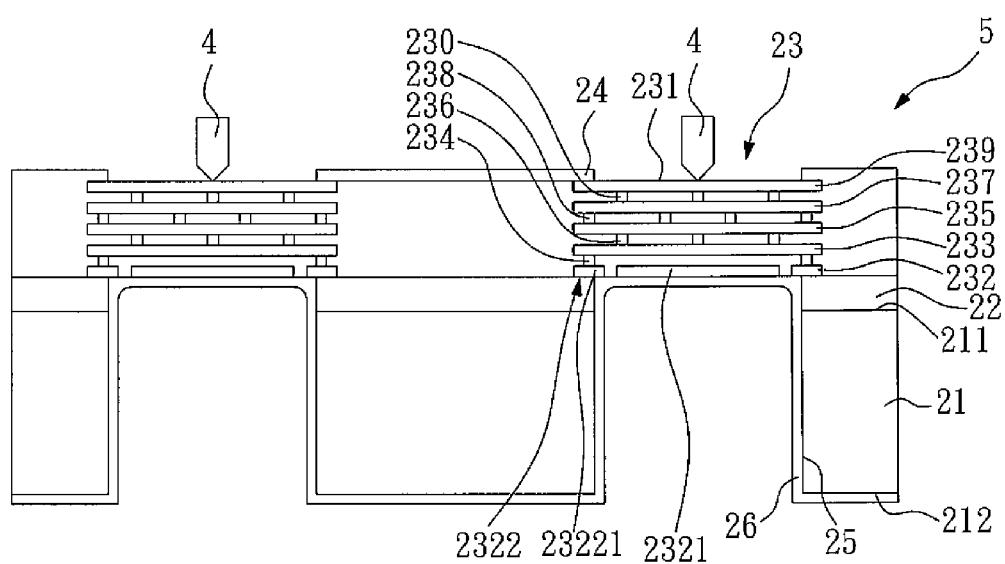
FIG. 7 is a schematic view of a method for testing a silicon wafer having testing pad(s) according to a second embodiment of the present invention.

FIG. 7 shows a schematic view of a method for testing a silicon wafer having testing pad(s) according to a second embodiment of the present invention. The method according to the second embodiment is substantially the same as the method (FIGS. 3 to 6) according to the first embodiment, and the same elements are designated by the same reference numbers. The method according to the second embodiment is different from the method according to the first embodiment in the amount of the testing pads 23 of the silicon wafer 5 and the position of the first probes 4. The silicon wafer 5 is a silicon wafer having testing pad(s) according to a third embodiment of the present invention. The silicon wafer 5 has at least two testing pads 23, and the first probes 4 contact the surface 231 of the testing pads 23 respectively.

Figure 8:
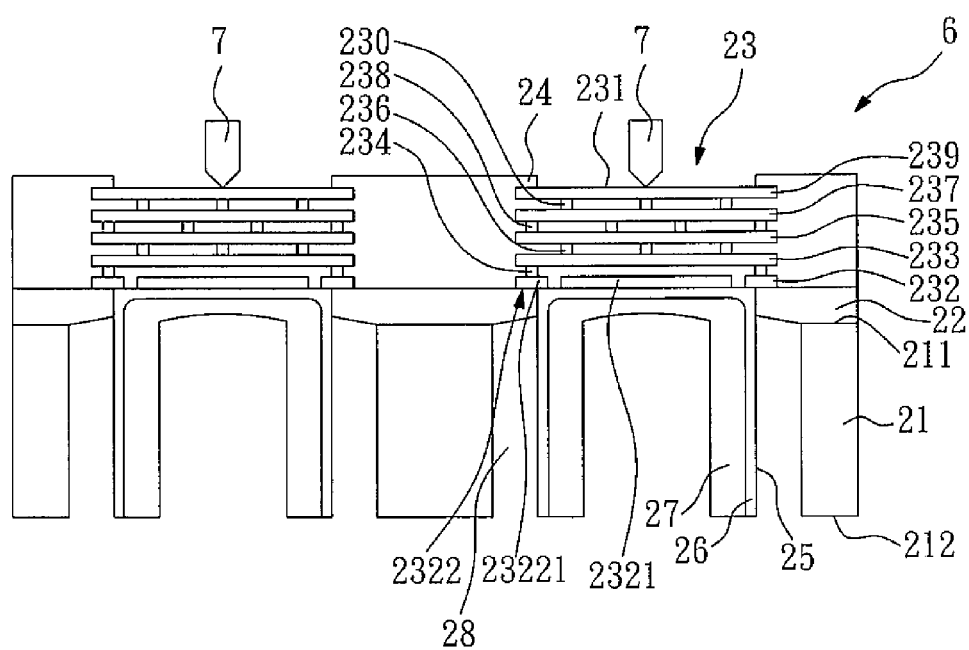
FIG. 8 is a schematic view of a method for testing a silicon wafer having testing pad(s) according to a third embodiment of the present invention.

FIG. 8 shows a schematic view of a method for testing a silicon wafer having testing pad(s) according to a third embodiment of the present invention. The method according to the third embodiment is substantially the same as the method (FIGS. 3 to 6) according to the first embodiment, and the same elements are designated by the same reference numbers. In the embodiment, the silicon wafer comprises a plurality of testing pads 23. Moreover, the method further comprises the following steps.

First, the measured resistance confirms that the seed layer 26 contacts the second area 2322 of the first metal layer 232. Thus, a conducting layer 27 is formed on the seed layer 26. Preferably, the material of the conducting layer 27 is copper. Then, part of the seed layer 26 and part of the conducting layer 27 that are disposed on the second surface 212 of the silicon substrate 21 are removed (for example, by grinding), and then part of the silicon substrate 21 is removed from the second surface 212 of the silicon substrate 21, so as to form at least one groove 28. The groove 28 surrounds the seed layer 26. Meanwhile, a silicon wafer 6 having testing pad(s) according to a fourth embodiment of the present invention is formed. In the embodiment, the groove 28 is formed by etching. However, in other applications, the method further comprises a step of forming an isolating material in the groove 28.

Finally, resistance is measured by two second probes 7. In the embodiment, the second probes 7 contact the surface 231 of the testing pads 23 respectively.

The material of the silicon substrate 21 is silicon, which is semi-conductor, and the silicon substrate 21 is electrically connected to the pads 23 through the seed layer 26, which means that only when the groove 28 completely penetrates through the silicon substrate 21, the circuit between the pads 23 is open. If the resistance exceeds a critical value, it shows that the circuit between the pads 23 is open, that is, the groove 28 completely penetrates through the silicon substrate 21, and thus the yield rate is high. If the resistance is below the critical value, it shows that a loop is formed between the pads 23, that is, the groove 28 does not penetrate through the silicon substrate 21, and thus the yield rate is low. Therefore, the resistance between the pads 23 is measured to estimate whether the groove 28 completely penetrates through the silicon substrate 21. Therefore, the groove 28 is estimated whether it is qualified, so as to determine the necessity of the following processes. Thus the yield rate of product is increased.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms illustrated, and that all modifications which maintain the spirit and scope of the present invention are within the scope defined by the appended claims.

What is claimed is:

1. A silicon wafer having testing pad(s), comprising:
    a silicon substrate, having a first surface and a second surface;
    an insulation layer, disposed on the first surface of the silicon substrate;
    at least one testing pad, disposed on the insulation layer and having a surface, wherein the testing pad comprises: a first metal layer, disposed on the insulation layer, wherein the first metal layer has a first area and a second area, the first area and the second area are separated from each other; a second metal layer, disposed above the first metal layer; and at least one first interconnection metal, connecting the second area of the first metal layer and the second metal layer;
    a dielectric layer, disposed on the insulation layer and exposing the surface of the testing pad;
    at least one through hole, penetrating through the silicon substrate and the insulation layer, and exposing part of the first metal layer; and
    at least one seed layer, disposed on a wall of the through hole and the second surface of the silicon substrate, wherein the at least one seed layer contacts the first area and the second area of the first metal layer, and is electrically connected to the surface of the testing pad through the second area.

2. The silicon wafer as claimed in claim 1, wherein the second area of the first metal layer surrounds the first area, and the second area is annular.

3. The silicon wafer as claimed in claim 1, wherein the second area of the first metal layer surrounds the first area, and the second area has a plurality of sub-areas.

4. The silicon wafer as claimed in claim 1, wherein the testing pad further comprises a third metal layer, at least one second interconnection metal, a fourth metal layer, at least one third interconnection metal, a fifth metal layer and at least one fourth interconnection metal, the third metal layer is disposed above the second metal layer, the second interconnection metal connects the second metal layer and the third metal layer, the fourth metal layer is disposed above the third metal layer, the third interconnection metal connects the third metal layer and the fourth metal layer, the fifth metal layer is disposed above the fourth metal layer, and the fourth interconnection metal connects the fourth metal layer and the fifth metal layer.

5. The silicon wafer as claimed in claim 1, further comprising at least one conducting layer and at least one groove, wherein the conducting layer is disposed on the seed layer, and the groove surrounds the seed layer.

6. The silicon wafer as claimed in claim 5, further comprising an isolating material, wherein the isolating material is disposed in the groove.

7. The silicon wafer as claimed in claim 1, wherein the material of the insulation layer is silicon oxide or polymer.

8. The silicon wafer as claimed in claim 1, wherein the first area and the second area are not connected to each other.

9. The silicon wafer as claimed in claim 1, wherein the first area of the first metal layer and the second metal layer are not connected to each other.

10. The silicon wafer as claimed in claim 1, wherein the through hole exposes the second area of the first metal layer.

11. A silicon wafer having testing pad(s), comprising:
    a silicon substrate, having a first surface and a second surface;
    an insulation layer, disposed on the first surface of the silicon substrate;
    at least one testing pad, disposed on the insulation layer and having a surface, wherein the testing pad comprises: a first metal layer, disposed on the insulation layer, wherein the first metal layer has a first area and a second area, and wherein. the first area and the second area are electrically insulated with each other, a second metal layer, disposed above the first metal layer, at least one first interconnection metal, connecting the second area of the first metal layer and the second metal layer;
    at least one through hole, penetrating through the silicon substrate and the insulation layer, and exposing part of the first metal layer; and
    at least one seed layer, disposed on a wall of the through hole and the second surface of the silicon substrate, wherein the at least one seed layer contacts the first area and the second area of the first metal layer, and is electrically connected to the surface of the testing pad through the second area;
    wherein the second area of the first metal layer surrounds the first area and the second area has a plurality of sub-areas.

12. The silicon wafer as claimed in claim 11, further comprising a third metal layer, disposed above the second metal layer and at least one second interconnection metal; and at least one second interconnection metal, connecting the second metal layer and the third metal layer.

13. The silicon wafer as claimed in claim 11, wherein the second area of the first metal layer is annular.

14. The silicon wafer as claimed in claim 11, further comprising at least one conducting layer and at least one groove, wherein the conducting layer is disposed on the seed layer, and the groove surrounds the seed layer.

15. The silicon wafer as claimed in claim 14, further comprising an isolating material, wherein the isolating material is disposed in the groove.

16. The silicon wafer as claimed in claim 11, further comprising a dielectric layer, disposed on the insulation layer and exposing the surface of the testing pad.

17. The silicon wafer as claimed in claim 11, wherein the first area and the second area are not connected to each other.

18. The silicon wafer as claimed in claim 11, wherein the first area of the first metal layer and the second metal layer are not connected to each other.

* * * * *